United States Patent [19]

Mori et al.

[11] Patent Number: 4,534,820
[45] Date of Patent: Aug. 13, 1985

[54] METHOD FOR MANUFACTURING CRYSTALLINE FILM

[75] Inventors: Hidefumi Mori; Masahiro Ikeda, both of Tokyo, Japan

[73] Assignee: Nippon Telegraph & Telephone Public Corporation, Tokyo, Japan

[21] Appl. No.: 434,536

[22] Filed: Oct. 15, 1982

[30] Foreign Application Priority Data

Oct. 19, 1981 [JP] Japan ................... 56-166950
Aug. 9, 1982 [JP] Japan ................... 57-137392

[51] Int. Cl.$^3$ ................... C30B 25/04; C30B 3/00
[52] U.S. Cl. ................... 156/603; 136/261; 156/DIG. 64; 156/DIG. 70; 427/86
[58] Field of Search ....... 156/603, DIG. 88, DIG. 64, 156/DIG. 70; 427/86; 65/60.8; 136/261, 262

[56] References Cited

U.S. PATENT DOCUMENTS 4,058,418 11/1977 Lindmayer ................... 148/175
4,333,792 6/1982 Smith ................... 156/612
4,350,561 9/1982 Little ................... 156/624

FOREIGN PATENT DOCUMENTS 57-10224 1/1982 Japan.

OTHER PUBLICATIONS

Diataxial Growth of Silicon and Germanium, Klykov et al., Journal of Crystal Growth, 52, (1981), pp. 687–691.
CW Laser Recrystallization of <100> Si on Amorphous Substrates, Gibbons et al., Appl. Phys. Lett., 34 (12) Jun. 15, 1979.
Fifth International Conference on Vapor Growth and Epitaxy, Jul. 19–24, 1981—pp. 195 and 196.
From "Fifth International Conference on Vapor Growth and Epitaxy", Jul. 19–24, 1981—pp. 199 and 200.
Silicon Graphoepitaxy Using a Strip-Heater Oven, by Geis et al., Sep. 1, 1980, pp. 454–456.
Crystallographic Orientation of Silicon—by Geis et al., Jul. 1, 1979, pp. 71–74.

Primary Examiner—Hiram H. Bernstein
Assistant Examiner—Joseph P. Carrier

[57] ABSTRACT

A thin film of a metal of which eutectic or compound is produced together with a semiconductor which is to be grown in its crystalline form is deposited on an amorphous (quartz glass) substrate. The thin film is patterned with a periodic pattern of a polygon having cross angles of multiples of about 60°, then the resulting substrate is heated at a temperature higher than the eutectic temperature of the metal and the semiconductor, and the semiconductor is deposited on the thin film under such heating condition, so that a crystalline film of the semiconductor is precipitated on the substrate. Such crystalline film is grown on a planar substrate at a low temperature of about eutectic temperature.

17 Claims, 14 Drawing Figures

FIG_1A
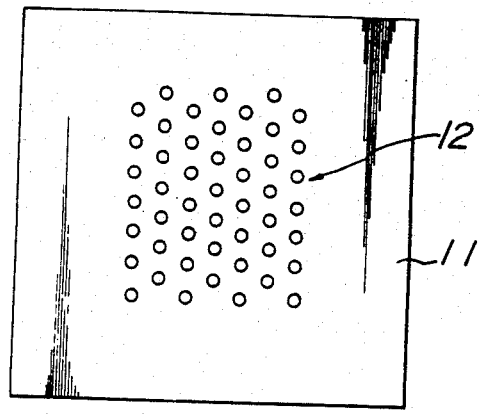
FIG_1B
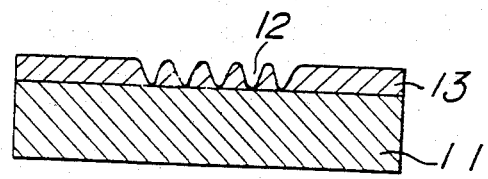
FIG_1C
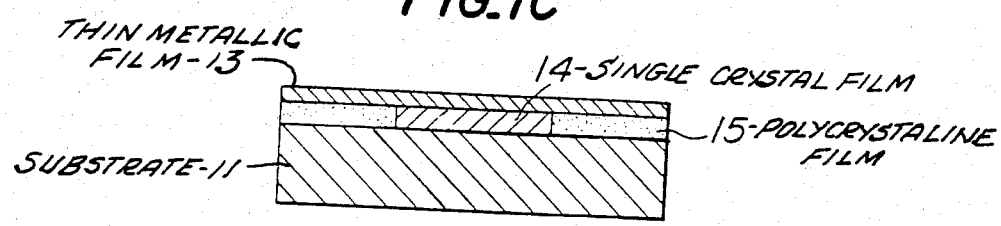

METHOD FOR MANUFACTURING CRYSTALLINE FILM

BACKGROUND OF THE INVENTION

The present invention relates to a method for manufacturing a crystalline film, and particularly to a method for growing a crystalline film of a semiconductor material such as silicon on an amorphous material such as glass or metal substrate.

Heretofore, liquid phase epitaxial, chemical vapor deposition, evaporation, sputtering, or the like methods have been known as a method for producing a crystalline film. In any of these methods, a crystalline film is grown by the use of a seed crystal. Namely, according to such a method, a single-crystal substrate is adopted as substrate, and it is required to coincide the lattice constant of a crystal to be grown with that of the single crystal of the aforesaid substrate in order to obtain a favorable crystalline film.

However, if it is possible to grow a crystalline film with a good quality on an amorphous substrate such as glass or the like, it is apparent that inexpensive solar cells, panel displays of large area, or the like can be manufactured.

Graphoepitaxy method has been known as a method for growing silicon single crystal on an amorphous substrate (see M. W. Geis, D. C. Flanders and H. I. Smith, "Applied Physics Letters", vol. 35, page 71 (1979)) in which a relief having a depth of about 100 nm with a period of 3 μm is fabricated on an insulating amorphous substrate in the form of grating. Amorphous silicon is deposited thereon in accordance with chemical vapor deposition (CVD) method, and then the amorphous silicon is crystallized in accordance with laser anneal method. Here, the crystal orientation in case of the crystallization is controlled by means of the relief formed on the substrate.

However, the above graphoepitaxy method has such a disadvantage in that when laser output of the anneal is increased to elevate crystal quality thereof, a rectangular shape of the aforesaid relief in cross section is deformed by means of heat, and as a result, the favorable crystal cannot be obtained. Also, there is a further disadvantage in that the aforesaid method requires a cap film ($SiO_2$ or $Si_3N_4$) in case of the crystallization so that the process becomes complicated.

Another example of graphoepitaxy method is disclosed by M. W. Geiss et al in "Applied Physics Letters", vol. 37, page 454 (1980) in which a relief having a depth of 100 nm with a period of 1–4 μm is formed on the surface of a glass substrate being an amorphous substrate, silicon is deposited on the substrate in accordance with chemical vapor deposition method, then an oxide film is grown on the surface thereof and is heated by means of a stripe heater at 1300° C. for a period of 10–20 seconds, thereby to obtain a silicon crystalline film. However, this method has such disadvantages in that the oxide film must further be formed on the deposited silicon in order to obtain the crystalline film and that even a high temperature of 1300° C. is required for the crystallization.

In order to eliminate the disadvantages as mentioned above, Japanese Patent Laid-open Application No. 10224/1982 has been proposed. This publication discloses a method in which a metal such as Au or the like causing eutectic reaction with silicon at a low temperature is deposited on the whole surface of a quartz substrate on which reliefs are provided to form a metallic film, and then silicon single crystal is grown on the metallic film at a low temperature.

However, according to the method of Japanese Patent Laid-open Application No. 10224/1982, it is required that the relief on the substrate is precisely worked so as to have an angle of 109.5° in order to obtain the single-crystal film, because silicon has such a tendency that the silicon <111> is oriented in vertical direction with respect to the substrate plane.

Furthermore, while reactive sputter etching or the like technique has been utilized for working such relief as described above, it is very difficult to provide a relief having an ideal cross section, so that there is a limit for elevating the crystal quality.

Still another method has been disclosed by E. I. Givargizov et al. In "Fifth International Conference on Vapor Growth and Epitaxy", page 195 (1981) wherein a substrate is worked to form equilateral triangular cells thereon, then a gold thin film is deposited on the patterened substrate, thereafter the resulting substrate is maintained at a temperature of 950°–1100° C., and silicon is deposited on such the substrate in accordance with CVD method thereby to grow the crystal. However, this method has such a disadvantage in that the equilateral triangular cell has a large dimension, for instance, 10 μm, plural crystal nuclei are produced at the same time in the cell so that the film after the growth comes to be polycrystalline. In addition, the above method has another disadvantage in that a temperature, for heating the substrate is comparatively high, i.e., 950°–1100° C., inexpensive glass such as soda-lime glass or pyrex glass is deformed at such heating temperature so that such inexpensive glass cannot be utilized in this method.

A further method has been disclosed by B. Y. Tsaur et al. in "Fifth International Conference on Vapor Growth and Epitaxy", page 199 (1981) wherein a quartz substrate is patterned with a rectangular relief, gold is evaporated thereon, then the resulting substrate is maintained so as to have an angle of 20° with a raw material vapor flux, and the substrate is heated at a temperature of 300°–550° C. in this situation, whereby germanium is evaporated and crystallized on the substrate. However, this method has such a disadvantage in that the substrate is remarkably inclined with respect to the vapor flux, so that a good uniformity of the resulting crystalline cannot be expected.

SUMMARY OF THE INVENTION

Accordingly, it is an object of the present invention to provide a method for manufacturing a crystalline film in which the disadvantages as mentioned above are eliminated, so that no formation of oxide film is required, no heat treatment at a high temperature is necessary, and a favorable crystalline film can be obtained on an amorphous material or the like.

Another object of the present invention is to provide a method for manufacturing a single-crystal semiconductor thin film with good crystal quality.

Still another object of the present invention is to provide a method for easily manufacturing a single-crystal semiconductor thin film.

A further object of the present invention is to provide a method for manufacturing a single-crystal semiconductor thin film at a low temperature.

In order to achieve these objects, in a method for manufacturing a crystalline film according to the present invention, a thin film of a metal of which eutectic or compound is produced together with a material to be crystallized is deposited on an amorphous or metallic substrate. The metallic thin film thus obtained is patterned with a periodic relief having the same rotation symmetry as the crystal axis of crystal face growing preferentially in parallel to the substrate plane, and then the resulting substrate is heated at a higher temperature than the eutectic temperature of the material to be crystallized and the metal and to deposit the material to be crystallized on the metallic thin film, whereby the crystal is precipitated on the substrate from the material to be crystallized and the metallic thin film being in the eutectic condition.

In accordance with a preferred embodiment of the present invention, a thin film of a metal of which a eutectic or a compound is produced together with a semiconductor material to be precipitated is deposited on a planar amorphous substrate. The thin film is then patterned with a periodic pattern having a shape similar to that of crystal habit of the crystal to be precipitated, i.e., a periodic pattern of a polygon or a triangle having cross angles of multiples of about 60°. Then, the resulting substrate is heated at a higher temperature than the eutectic temperature of the material to be crystallized and the metal, so that the semiconductor material is deposited on the substrate with the patterned metal, whereby a single-crystal semiconductor thin film is formed.

According to another preferred embodiment of the present invention, a metal of which eutectic or compound is produced together with a semiconductor which is to grow in its crystalline form on a planar amorphous substrate is patterned with a periodic pattern of a polygon or a triangle having cross angles of multiples of about 60°, and then the resulting substrate is heated at a higher temperature than the eutectic temperature of the material to be crystallized and the metal, so that the semiconductor material is deposited on the substrate with the patterned metal, whereby a single-crystal semiconductor film is grown. After removing the metal, a fresh single-crystal semiconductor film is epitaxially grown on the aforesaid single-crystal semiconductor film.

Preferably, silicon may be used as the semiconductor. Moreover, the periodic pattern may be formed, for instance, by equilateral triangles or parallelograms having 60° and 120° cross angles.

BRIEF DESCRIPTION OF THE DRAWINGS

FIGS. 1A, 1B and 1C are front, cross-sectional and cross-sectional views, respectively, showing a substrate for explaining steps in a embodiment according to the present invention in which an Au film patterned with a periodic relief is disposed on the planar substrate thereby to obtain a crystalline film;

DETAILED DESCRIPTION OF THE PREFERRED EMBODIMENTS

Figure 2A:
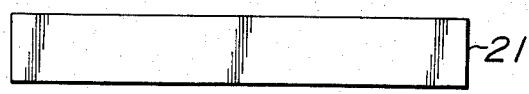
FIGS. 2A-2F are cross-sectional views showing a substrate for explaining successive steps in another embodiment according to the present invention.

The present invention will be described in more detail hereinbelow.

According to the invention, first, a metal which has been deposited on an amorphous substrate is periodically relieved. The planar shape of periodic relief has the same rotation symmetry as that of the crystal axis of a crystal face growing preferentially in parallel to the surface of the substrate in the case where the crystal is precipitated on the substrate from an eutectic solution of a metal and a material to be crystallized. Namely, it is required to align artificially crystal orentation in order that a crystalline film with a good quality is grown on the amorphous or metallic substrate, and a single-crystal thin film is further grown thereon. For instance, in the case where silicon semiconductor is deposited on a glass substrate in accordance with an evaporation method or the like, it has been known that a particular crystal face grows in parallel to the substrate owing to an influence of the substrate plane, if a temperature of the substrate is within a range of 500°–600° C. or more. In this respect, another crystal axis may be orientated in accordance with another process for the sake of producing a crystalline thin film having favorable crystal quality. In the present invention, such another orientation of crystal axis is effected by means of a periodic relief having the same rotation symmetry as that in the case that the crystal face orientated in parallel to the substrate plane is observed from a vertical direction with respect to the substrate.

According to the present invention, such periodic relief as mentioned above is formed in such a manner that a metallic thin film is deposited on an amorphous substrate, a metallic substrate or the like, and that a periodic relief is formed on the metallic thin film.

It is preferable that such relief as stated above has a period of 10 μm or less, and most preferable 1 μm–3 μm. This is because favorable crystal is hard to grow, if the relief has a period of more than 10 μm.

Any material which can form an eutectic or a compound together with a metal to precipitate crystal may be fundamentally used for such material to be crystallized as mentioned above. For instance, the material may be Si, Ge, and in addition, GaAs, GaP, InP, GaAsP or the like being a compound semiconductor.

On the other hand, any metal can be used as the above-mentioned metal as far as the metal can form an eutectic or a compound together with any material to be crystallized as described above to precipitate crystal. For example, the metal may be Au, Ag, Al, Pt, Pd, Ga, In, Pb or the like.

It is preferable that a thickness of the deposited metal is 300 Å or more. If a thickness of the deposited metal is thinner than 300 Å, only small crystal is obtained.

As a non-crystalline substrate, either an amorphous material other than quartz glass, for instance, ordinary glass, $Si_3N_4$ or the like, or a metallic material such as stainless steel or the like may be employed.

Furthermore, it is preferable to provide a layer being composed of a material to be crystallized between the substrate and the metallic thin film in the present invention. The interposition of this layer results in uniformity of the resulting crystalline thin film.

A process for depositing crystal from the aforesaid metallic thin film and the material to be crystallized is not also limited to a specific process in the present invention, and accordingly, for example, a process of evaporation, sputterring or chemical vapor deposition may be utilized.

In this case, a temperature of the substrate is maintained at a temperature in the vicinity of the eutectic temperature or more, or at a temperature in the vicinity of the temperature of production of the compound or more, so that desired crystal is precipitated.

EXAMPLE 1

FIGS. 1A–1C show steps in an embodiment in which silicon crystal is grown on a quartz glass substrate according to the present invention. When silicon is precipitated on a planar quartz substrate 11 from Si-Au fused alloy by using Au as a metallic thin film 13, a (111) plane is preferentially grown in parallel to the substrate plane to produce crystal grains of equilateral triangle. Thus, the Au film 13 patterned with a periodic relief 12 as shown in FIG. 1A is fabricated on the quartz substrate 11. Such pattern may be fabricated by, for example, the following manner after the deposition of an Au film having a thickness of about 0.1 $\mu$m on the quartz substrate 11 by evaporation. Namely, a resist (for instance, "AZ 1350J" manufactured by Shipley Co.) is applied on the Au film 13, and then, the aforesaid resist is exposed with a grating under a condition of interference of laser light derived from, for instance, He-Cd laser or the like. Thereafter, the substrate 11 is rotated by 60°, laser light interferenced similarly is irradiated to expose another grating for placing the same upon the aforesaid grating, and developing treatment is made thereupon. As the result, a periodic resist pattern is formed on the Au film 13. When the Au film 13 is etched by utilizing the resulting resist as its mask in accordance with sputter etching process or the like, the periodic relief 12 with a desired pattern is obtained as shown in FIG. 1A. The cross section of the substrate 11 having the Au film 13 with the periodic relief 12 thus obtained is shown in FIG. 1B.

Thereafter, the substrate 11 patterned with the periodic relief 12 is placed in a vacuum evaporator. After the evaporator is evacuated to maintain vacuum, the resulting substrate 11 is heated at a temperature, for example, 380° C., higher than the eutectic temperature 377° C. of silicon and gold and silicon is succeedingly evaporated to deposit the same on the substrate 11. The silicon thus deposited reacts successively with gold to form fused alloy at a certain concentration. The periodic relief of gold is preserved in this step. With the progress of evaporation, an excess of silicon in fused alloy begins to precipitate on the substrate 11. Since there is the periodic relief 12 patterned on the Au film of the substrate 11, the precipitated silicon crystal is affected by the relief 12; i.e., the sides of the silicon crystals are aligned by the periodic relief structure so that an orientated silicon crystalline film 14 is obtained as shown in FIG. 1C. In this embodiment, if a silicon film having a thickness of about 100 Å had previously been evaporated between the substrate 11 and the Au film 13, uniformity of the crystalline film was elevated. Moreover, it has been found that if such the silicon film is prepared by ion plating, more advantageous effects can be obtained.

As a result of electron diffraction analysis, the silicon crystalline film 14 was a single-crystal thin film whose (111) plane is orientated in parallel to the substrate 11. Further, reference numeral 15 denotes a polycrystalline film.

While double exposure of grating was adopted as a means for forming the periodic relief 12 in Example 1, any pattern having a rotation symmetry similar to that of the periodic relief 12 may also be employed, and accordingly a process in which a mask being utilized in usual photolithograph may also be used.

EXAMPLE 2

Figure 2B:
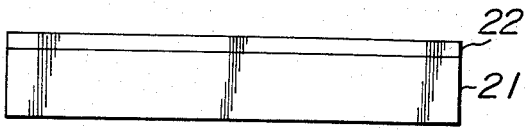

FIGS. 2A–2F are cross-sectional views showing successive steps in another embodiment according to the present invention. FIG. 2A shows a substrate such as a quartz glass substrate 21. A metallic film 22 forming an eutectic or compound with a semiconductor, of which single crystal is to be grown, for example, a gold film 22, in the case where the semiconductor is, for instance, silicon, is deposited on the substrate 21 with a thickness of, e.g., 1000 Å in accordance with an evaporation method or the like to obtain a structure as shown in FIG. 2B.

Figure 2C:
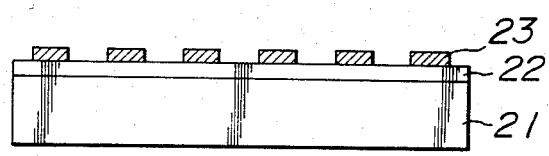

The structure is patterned with a resist pattern 23 of a desired shape to obtain a patterned structure as shown in FIG. 2C. Thereafter, the gold film 22 is etched by utilizing the resulting resist pattern 23 as its mask in accordance with sputter etching process or the like to form a metallic (gold in this example) pattern 24 with a periodic figure of a polygon having a cross angle of integer times about 60° thereby to obtain a structure shown in FIG. 2D.

Figure 3:
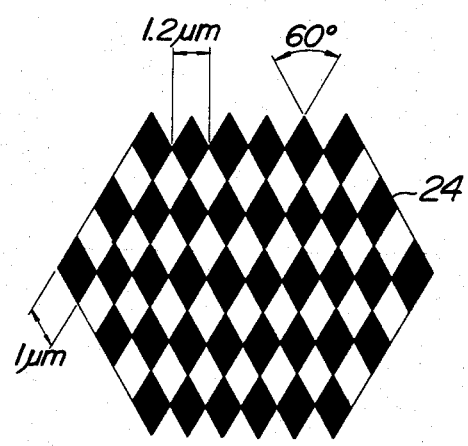
FIG. 3 is a diagram showing a periodic metallic pattern shown in FIG. 2D.

In this case, the gold pattern 24 has parallelogram shapes each having 60° and 120° cross angles and a spacing of 1 $\mu$m between the opposite sides as shown in FIG. 3. And such parallelogram gold pattern 24 has a period of 1.2 $\mu$m.

Figure 2D:
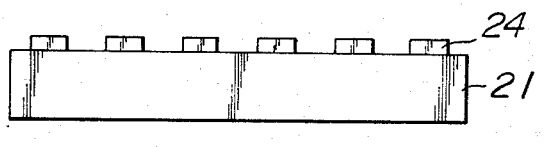
Figure 4A:
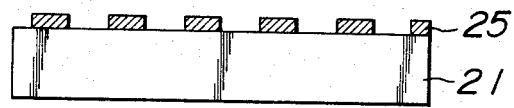
FIGS. 4A and 4B are cross-sectional views showing a substrate for explaining steps to form a metallic pattern in accordance with lift-off method.
Figure 4B:
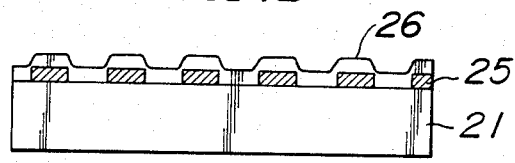

Meanwhile, in order to obtain the structure as shown in FIG. 2D, lift-off process in place of the treatments as illustrated in FIGS. 2B and 2C may be adopted. More specifically, the substrate 21 is patterned with a resist pattern 25 having a thickness of, for example, 0.7 $\mu$m to obtain a desired shape thereby producing the structure shown in FIG. 4A. Then, a gold film 26 is deposited on the structure with a thinner thickness than that of the resist pattern 25 in accordance with evaporation method or the like thereby to obtain the structure as shown in FIG. 4B. Thereafter, the gold film 26 on the resist pattern 25 is removed together with the resist pattern 25 by the use of acetone or the like in accordance with the lift-off process, so that a structure having the gold pattern 24 as shown in FIG. 2D is obtained.

In the formation of the resist pattern 23 or 25 when the gold pattern structure as shown in FIG. 2D is prepared, the following method may be applied. First, a resist (for instance, "AZ 1350J" manufactured by Shipley Co.) is applied on the quartz glass substrate 21, and then the aforesaid resist is exposed in the form of grating under a condition of interference of laser light derived from, for example, He-Cd laser or the like. Thereafter, the substrate 21 is rotated by 60°, and laser light similarly interferenced is irradiated to effect another grating-form exposure onto the aforesaid grating-form exposure. Then, when the resulting substrate is developed, the resist corresponding to portions each exposed in superposed state are removed in parallelogram shape, so that the resist pattern 23 or 25 of a desired shape is formed.

Figure 2E:
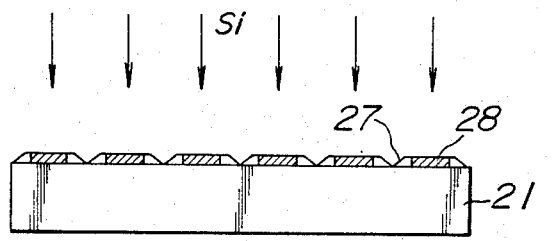
Figure 2F:
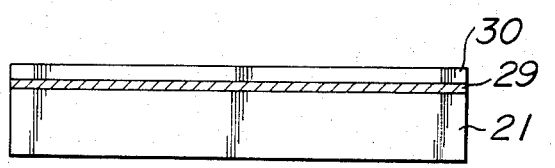

Next, silicon Si is evaporated on the whole surface of the substrate 21 at an evaporation rate of several Å/sec, for example, 3 Å/sec by utilizing silicon as semiconductor material as illustrated in FIG. 2E under a condition that the substrate 21 having the gold pattern 24 shown in FIG. 2D is heated at a temperature higher than the eutectic temperature 377° C. of silicon and gold, e.g., 380° C. The silicon thus evaporated reacts successively with gold, so that the silicon melts in the gold at a certain concentration to form a Si-Au eutectic alloy 27, which is in fused condition. As the evaporation proceeds, an excess of silicon begins to precipitate as crystal on the substrate 21 as indicated by reference numeral 28. In this precipitation, the (111) plane of the crystal of the precipitated silicon 28 is orientated in parallel to the substrate 21 and the crystal orientation of the precipitated silicon crystal is aligned along the substrate plane depending upon a shape of the gold pattern 24, so that a single-crystal silicon film 29 is formed on the substrate 21. Gold is transferred to the single-crystal silicon film 29 to form an Si-Au eutectic alloy thin film 30. As a result, a layer construction as shown in FIG. 2F is obtained. In this case, a thickness of the single-crystal silicon film 29 was 2000 Å.

When the layer construction shown in FIG. 2F thus obtained was subjected to elemental analysis along its depth direction in accordance with electron microprobe analysis, it was confirmed that the silicon layer 29 existed on the upper surface of the substrate 21, and that the Si-Au eutectic alloy layer 30 was positioned on the silicon layer 29. Also, as a result of investigation of its crystal quality with respect to the single-crystal silicon film 29 in accordance with transmission electron diffraction analysis, it was confirmed that the single crystal having the (111) plane is orientated in parallel to the substrate was formed.

In the construction shown in FIG. 2F, the Si-Au eutectic alloy layer 30 may be removed, if required.

Meantime, it is assumed that the reason why such single-crystal silicon can grow if a planar shape of the gold pattern 24 is made to be a polygon having cross angles of integer times about 60° is based on the following fact. Namely, the silicon evaporated reacts with gold to produce alloy. In this case, however, the substrate 21 is maintained at a temperature higher than the eutectic temperature so that such Si-Au alloy is in fused state. With progress of the silicon evaporation, ultimately silicon crystal precipitates in the Si-Au alloy. Since the precipitated crystal has a (111) plane orientated in parallel to the substrate plane, such crystal exhibits equilateral triangular crystal habit, and the orientation in the substrate plane is determined in such a manner that a surface tension which is given to the crystal from the Si-Au fused alloy is minimized.

Figure 5:
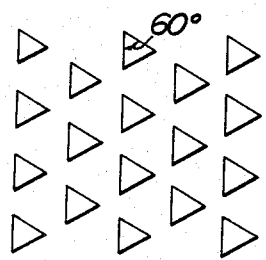
FIGS. 5 and 6 are diagrams showing other two examples of periodical metallic patterns, respectively.
Figure 6:
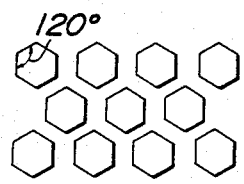

Accordingly, a shape of the gold pattern 24 is not necessarily limited to only those described in the above examples, but the most simple pattern is a periodic pattern of equilateral triangles as shown in FIG. 5. In addition, there are various modifications of patterns such as a pattern having cross angles of integer times 60° (e.g. 120°) as shown in FIG. 6 and the like. Besides, with reference to the cross angles of a polygon, it is not necessarily required that such cross angle is exactly set at 60° or angles being integer times larger than 60°.

While gold was used as the material of the metallic film in the above examples, any metal which produces an eutectic or compound together with silicon, for instance, aluminum, silver, tin, copper, platinum, nickel, palladium, gallium, indium or the like may also be employed.

It is necessary that a temperature at which the substrate is heated is substantially the eutectic temperature or a temperature at which the compound is produced, or a temperature higher than that enumerated above in order to precipitate semiconductor on the substrate.

Furthermore, while in the present example, evaporation method was adopted for supplying silicon, other processes such as chemical vapor deposition (CVD) process, sputtering process, plasma CVD process or the like may also be utilized.

In addition, if dopant is supplied simultaneously with the supply of silicon, the crystal involving the dopant can be grown.

In order to grow silicon with a favorable crystal quality, a thickness of the metallic film may be three hundred Å or more. In addition, after a metallic pattern of a periodic shape is formed thereon, the same type of metal is uniformly deposited on the whole surface of the metallic pattern with such a thickness, for example, about 500 Å or less, that the above-mentioned metallic pattern is transferred to the second metal. Thereafter, silicon may be deposited thereon.

Moreover, it is also possible to grow a silicon crystalline film of high purity on the crystalline film grown by the manner as described hereinabove in accordance with conventional silicon epitaxial method, as a matter of course.

With respect to the grating period of the metallic film pattern 24, it is sufficient that the period is several ten $\mu$m or less, and it is preferable that the period is about 1-3 $\mu$m.

While in Example 2 explanation has been made in the case of Si single crystal, Ge single crystal can also be fabricated in the same manner.

As described above, according to the present invention, crystal is precipitated from the eutectic alloy obtained from a material to be crystallized and metal, and at the same time the crystal orientation thereof is controlled by means of a periodic relief provided on a metallic layer deposited on a substrate having the same pattern as that of symmetry of the crystal in the case that the crystal is precipitated on the planar substrate, so that the following various advantages can be attained.

(1) A crystalline film with a good quality can be grown on a planar substrate at a low temperature.

(2) Because of the low temperature growth, inexpensive glass having a low softening temperature such as soda lime glass, pyrex glass or the like may be used as its substrate.

(3) Since the crystalline film can be grown at a low temperature, fresh crystal can be grown in the vicinity of a device which has previously been formed. Accordingly, lamination of such device is easily processed.

(4) Since the deposition is effected simultaneously with the growth of a material to be crystallized, addition of a dopant becomes possible at the time of the growth of the crystal so that processes for fabricating an element is simplified.

(5) The present invention is advantageously applied to integration of glass waveguide with semiconductor active device.

As apparent from the above description, the method of the present invention is effective for the fabrication of inexpensive solar cell as well as thin film transistor, three-dimensional large-scale integration, large scale panel display, hybrid integrated optical circuit or the like.

What is claimed is:

1. A method for manufacturing a crystalline film, comprising the steps of:

depositing a thin film of a metallic material of which a eutectic compound is produced together with a material to be crystallized, on a planar amorphous or metallic substrate;

patterning said thin film with a periodic relief having the same rotation symmetry as the crystal axis of a crystal face which is to be grown preferentially in parallel to the plane of said planar substrate, said periodic relief exposing said planar substrate corresponding to portions of said thin film removed by the patterning;

heating the resulting substrate on which said thin film patterned with said periodic relief is disposed at a temperature higher than the eutectic temperature of said material to be crystallized and said metallic material; and depositing said material to be crystallized on said thin film patterned with said periodic relief under the heating conditions, whereby a crystalline film is precipitated on the initial planar substrate from the euctectic alloy layer which is composed of said material to be crystallized and said metallic thin film by the above steps.

2. A method for manufacturing a crystalline film as claimed in claim 1, wherein said semiconductor is a member selected from the group consisting of Si, Ge, GaAs, GaP, GaAsP, and InP.

3. A method for manufacturing a crystalline film as claimed in claim 1, wherein said relief has a pitch of less than 10 $\mu$m.

4. A method for manufacturing a crystalline film as claimed in claim 1, further comprising the step of forming an extra film composed of the same material as said material to be crystallized on said planar substrate prior to the formation of said metallic thin film.

5. A method for manufacturing a crystalline film as claimed in claim 4, wherein said extra film is prepared by an ion plating method.

6. A method for manufacturing a crystalline film by growing a single-crystal thin film of a semiconductor on a planar amorphous substrate, said method comprising the steps of:

forming a resist pattern having a desired shape on a planar amorphous substrate;

depositing a thin film of a metal of which a eutectic compound is produced together with said semiconductor on the resulting substrate;

patterning said thin film with a periodic pattern of a polygon or a triangle having cross angles in a shape similar to the crystal habit of the crystal of said semiconductor to be precipitated by removing said resist pattern together with the thin film thereon, said periodic pattern thereby exposing said planar amorphous substrate corresponding to the portions of said thin film removed by said patterning; and depositing a semiconductor on said thin film patterned with said periodic pattern under the heating conditions, whereby a single-crystal thin film of said semiconductor is precipitated on the initial planar substrate.

7. A method for manufacturing a crystalline film by growing a single-crystal thin film of a semiconductor on a planar amorphous substrate, comprising the steps of:

deposition an initial thin film of a metal of which a eutectic compound is produced together with a semiconductor on a planar amorphous substrate;

patterning said initial thin film with a periodic pattern of a polygon or a triangle having cross angles in a shape similar to the crystal habit of a single crystal thin film of said semiconductor to be precipitated, said periodic pattern exposing said planar amorphous substrate corresponding to portions of said initial thin film removed by the patterning;

heating the resulting substrate on which said initial thin film patterned with said periodic pattern is disposed at a temperature higher than the eutectic temperature of said semiconductor and said metal; and depositing said semiconductor on said initial thin film patterned with said periodic pattern under the heating conditions, whereby said single crystal thin film of said semiconductor is precipitated on the initial planar substrate.

8. A method for manufacturing crystalline film as claimed in claim 7, wherein said periodic pattern is formed of equilateral triangles.

9. A method for manufacturing a crystalline film as claimed in claim 7, wherein said periodic pattern is formed of parallelograms each having cross angles of 60° and 120°.

10. A method for manufacturing a crystalline film as claimed in claim 7, which further comprises the steps of:

removing an eutectic alloy layer, which consists of said metal and said semiconductor and remains on said single-crystal thin film of said semiconductor after said single-crystal thin film has been precipitated on the inititial planar substrate from said single crystal thin film and said initial planar substrate; and growing epitaxially a fresh single-crystal semiconductor film on said single-crystal thin film.

11. A method for manufacturing a crystalline film as claimed in claim 7, which further comprises the step of forming, prior to said heating step, metallic thin film on the patterned initial thin film, wherein said second metallic thin film is formed of the same metal as said initial thin film, and wherein the thickness of the second metallic thin film is such that said periodic pattern is transferred to said second metallic thin film.

12. A method for manufacturing a crystalline film as claimed in claim 7, wherein said periodic pattern has a pitch of less than 10 $\mu$m.

13. A method for manufacturing a crystalline film as claimed in claim 7, wherein said cross angles are multiples of about 60°.

14. A method for manufacturing a crystalline film as claimed in claim 13, wherein said semiconductor is a member selected from the group consisting of Si and Ge.

15. A method for manufacturing a crystalline film as claimed in claim 14, wherein a dopant is also supplied to said initial thin film at the time of depositing said semiconductor on said initial thin film to grow a single crystal thin film containing said dopant.

16. A method for manufacturing a crystalline film as claimed in claim 14, wherein said metal is a member selected from the group consisting of Au, Ag, Al, Ni, Pt, Cu, Sn, Pd, Ga, In, and Pb.

17. A method for manufacturing a crystalline film as claimed in claim 14, wherein said planar substrate is made of stainless steel or an amorphous material selected from the group consisting of quartz, glass, soda lime glass, pyrex glass and $Si_3N_4$.

* * * * *